United States Patent [19]

Benjamin et al.

[11] Patent Number: 4,571,606
[45] Date of Patent: Feb. 18, 1986

[54] HIGH DENSITY, HIGH VOLTAGE POWER FET

[75] Inventors: James A. Benjamin, Waukesha, Wis.; Robert W. Lade, Fort Myers, Fla.; Herman P. Schutten, Milwaukee; Stanley V. Jaskolski, Sussex, both of Wis.

[73] Assignee: Eaton Corporation, Cleveland, Ohio

[21] Appl. No.: 390,484

[22] Filed: Jun. 21, 1982

[51] Int. Cl.⁴ ............................................ H01L 29/78
[52] U.S. Cl. .................................. 357/23.4; 357/23.8; 357/23.14; 357/43; 357/55; 357/59; 357/86
[58] Field of Search ...... 357/23 VD, 23 MG, 23 HV, 357/43, 55, 59, 86, 23.4, 23.8, 23.14

[56] References Cited

U.S. PATENT DOCUMENTS

| | | | |
|---|---|---|---|
| 3,629,667 | 12/1971 | Lubart et al. | 357/51 |
| 4,072,975 | 2/1978 | Ishitani | 357/23 VD |
| 4,152,714 | 5/1979 | Hendrickson et al. | 357/41 |
| 4,172,260 | 10/1979 | Okabe et al. | 357/23 HV |
| 4,199,774 | 4/1980 | Plummer | 357/23 VD |
| 4,414,560 | 11/1983 | Lidow | 357/23 VD |

OTHER PUBLICATIONS

J. Tihanyi et al., "Funct. Integ. of Power MOS and Bipolar Devices" Proc. 1980 IEEE IEDM, Dec. 1980, pp. 75-78.
"Optimum Doping Profile for Minimum Ohmic Resistance and High Breakdown Voltage" C. Hu; IEEE Transactions Electron Devices; vol. ED-26; 1979, pp. 243-244.

Primary Examiner—Joseph E. Clawson, Jr.
Attorney, Agent, or Firm—Andrus, Sceales, Starke & Sawall

[57] ABSTRACT

Lateral FET structure is disclosed with an insulative region such as porous silicon filled with oxide formed in the drift region to divert the drift region current path and increase the length thereof to afford higher OFF state blocking voltage without increasing lateral dimensions. Combinations involving bidirectional power switching structures are also disclosed, as well as a multicell matrix array.

5 Claims, 16 Drawing Figures

Fig. 1 VMOS FET PRIOR ART

Fig. 2 DMOS FET PRIOR ART

Fig. 3 VMOS WITH POLY-SI GATE PRIOR ART

Fig. 5 PRIOR ART

Fig. 4 PRIOR ART DMOS WITH POLY-SI GATE (HEX FET)

Fig. 6 PRIOR ART SIPMOS FET

Fig. 11  PRIOR ART
LATERAL MOSFET

HIGH DENSITY, HIGH VOLTAGE POWER FET

TECHNICAL FIELD

The invention relates to power switching semiconductors, and more particularly to power MOSFETs (metal oxide semiconductor field effect transistors), and the like.

BACKGROUND

The present invention evolved from efforts to develop a solid state device for high power switching applications to replace the low current circuit breaker or contactor, though the invention is of course not limited thereto. Performance requirements for such a device are demanding, and even modest specifications might include a 400 volt blocking capability with a corresponding ON state resistance of 0.05 ohms and an AC current rating 20 amps rms. Further, the system should be capable of interrupting a fault current of 5,000 amps without destroying itself. Additionally, manufacturing cost should be less than or equal to the circuit breaker or contactor cost.

High power switching in solid state devices has evolved over the last 30 years from the early milliwatt devices to the present kilowatt "hockey puck" thyristor devices. Device processing has evolved from the early restrictive alloy/rate grown devices to planar and MOS VLSI structures, bringing the blocking voltages of switches from the 10 volt level of the 1950's to the 30 kilovolt range today. Even with these great strides, however, the problem of developing a semiconductor device to replace the low current circuit breaker or contactor has remained unsolved.

There are three likely candidates for high power switching applications. Two of these are bipolar, i.e. they depend on the flow of two types of carriers, majority and minority. The third is unipolar, i.e., it depends only on majority carrier current flow.

The first two candidates are the thyristor and the bipolar transistor. Although the thyristor is capable of blocking a high reverse voltage, it can be characterized in the forward ON state by a fixed voltage source (one junction drop) and a resistance with a negative temperature coefficient, i.e., resistance decreases with increasing temperature. The bipolar transistor can be characterized in the forward ON state simply as a resistance with a negative temperature coefficient. In each case, it is extremely difficult to accommodate large current ratings through the paralleling of bipolar devices due to the effect of "current hogging". If a number of these devices are paralleled, and if one unit draws slightly more current than the others, it will heat up and its resistance will be reduced. This results in a still larger share of the current, further heating, etc. The result is usually the thermal destruction of that device and the subsequent overloading of the others. In general, current hogging prevents paralleling of these devices unless ballast resistance, a form of stabilizing negative feedback, is introduced. This resistance further adds to the total ON state resistance and is therefore highly undesirable. Other disadvantages are false dv/dt triggering of thyristors, and secondary breakdown problems in bipolar transistors.

The third candidate, the field effect transistor (FET), is exclusively a majority carrier device. Its resistance is related to temperature through the electron mobility. Its resistance has a positive temperature coefficient, namely the resistance is proportional to $T^{3/2}$. Since the electron mobility is 2.5 times greater than the hole mobility in silicon, the n channel device leads to lower ON state resistance. Further, since MOS devices give conductivity enhancement in the ON state, these devices are generally more conductive than their junction depletion-mode counterparts (JFET). Additionally, since minimal channel length (for low ON state resistance) and high packing densities are desirable, the vertical power MOS FET presently is leading all others in the power switching field.

Current commercially available MOSFETs have performance specifications approximately one order of magnitude below the minimal requirements noted above. Two current designs are the SIPMOS device and the HEXFET device, discussed more fully hereinafter.

In lateral power FETs, there is an inherent trade-off between voltage blocking capability and the lateral dimension or length of the drift region. Minimum ON state resistance demands minimum drift region length. But maximum blocking voltage commands maximum drift region length. This relationship is characterized by the equation $$R_{on} = k V_B^{2.6} \text{ ohm-cm}^2$$

where $R_{on}$ is the ON state resistance, k is a constant $(3.7 \times 10^{-9})$, and $V_B$ is the blocking voltage. This relationship has been studied in the literature, C. Hu, "Optimum Doping Profile For Minimum Ohmic Resistance and High Breakdown Voltage", IEEE Transactions Electron Devices, Volume ED-26, pages 243-244, 1979.

SUMMARY

The present invention provides lateral power FET structure with increased voltage blocking capability in the OFF state, and reduced ON state resistance. The previously limiting trade-off between blocking voltage $V_B$ and ON state resistance $R_{on}$ is circumvented by the structure of the present invention. Blocking voltage $V_B$ is increased without increasing the lateral dimension of the drift region.

The invention provides lateral FET structure with higher voltage blocking capability in a smaller lateral area.

In a further aspect, the invention also provides in one embodiment lateral FET structure affording both the noted high density and high blocking voltage, and which is bidirectional, i.e. current can flow in either direction when the device is in the ON state. This structure called high density EFET, enables substantial voltage blocking capability in the OFF state, including a non-floating gate which may be tied or referenced to the same potential reference level as one of the main electrodes in the OFF state. The invention prevents unwanted inducement of conduction channels through the drift region in the OFF state.

The structure of the invention is simple, accurately reproducible, and suitable for manufacture in a repetitive matrix array on a semiconductor chip. The higher voltage blocking capability of each FET cell within the same lateral area enables an increased number of FET cells to be integrated within a given chip area. This increased number of FET cells, when connected in parallel, further reduces the ON state resistance. Higher blocking voltage is afforded without increasing the lateral dimension of the drift region, and hence without having to reduce the number of cells per unit area. The invention thus affords a high density, high voltage FET structure.

BRIEF DESCRIPTION OF THE DRAWINGS

Prior Art

FIGS. 1 through 11 show prior art.

Present Invention

FIGS. 12 through 16 illustrate the present invention.

DESCRIPTION OF PRIOR ART AND POWER MOSFET TECHNOLOGY

MOSFETs can generally be classified into two groupings according to the principle orientation of current flow, namely vertical and lateral. For the vertical units, there are two predominant geometries, planar (HEXFET, TMOS, SIPMOS, etc.), and non-planar (VMOS, UMOS, etc.). The advantage that these devices enjoy over their lateral counterparts is that the drain contact is placed on the bottom of the chip. Thus, for a given chip area, higher current ratings (higher packing densities) are possible. As a consequence, almost all power MOSFET design has been concentrated on vertical configurations.

Figure 1:
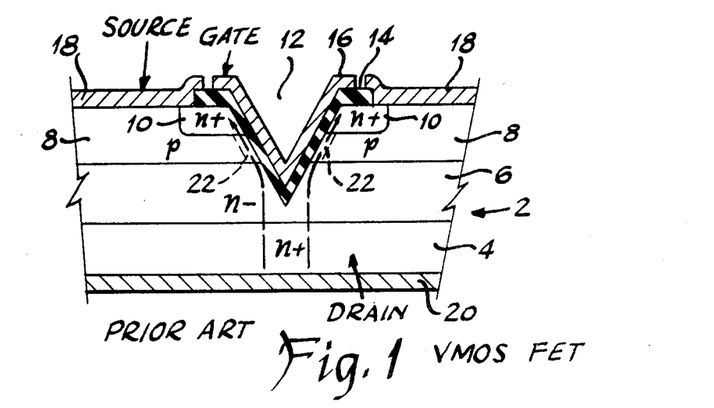
FIG. 1 is a schematic cross-sectional view of a VMOS FET.

A cross-sectional view of a typical non-planar vertical device is illustrated in FIG. 1, showing a VMOS structure 2. The starting material is an n+ silicon wafer 4 with an n− epitaxial layer 6. Successive p and n+ diffusions are carried out, yielding layers 8 and 10. A groove is anisotropically etched to yield V-groove 12. An insulating oxide layer 14 is formed in the groove, followed by deposition of gate metalization 16. Source metalization 18 is deposited on the top major surface, and drain electrode metalization 20 is deposited on the bottom major surface.

FET channel 22 is through p region 8 along the edge of the V-groove. Upon application of a positive voltage on gate electrode 16 relative to source electrode 18, electrons in p region 8 are attracted into channel 22 to invert the conductivity type of the channel to n type. Electrons may then flow from source region 10 through channel 22 to drain region 4, and hence current may flow from drain electrode 20 through drain region 4 through channel 22 through source region 10 to source electrode 18.

One of the main advantages of the VMOS design is that the active channel length is extremely small and is determined by the difference in depth between the n+ source diffusion 10 and the p body diffusion 8. The technology in diffusion is sufficiently well advanced so that this dimension can be very tightly controlled. Thus the channel resistance can be closely held to a maximum specification.

One type of VMOS or UMOS (truncated VMOS) design is the notched MOSFET structure, for example "A Parametric Study of Power MOSFETs", C. Hu, IEEE Electron Device Conference, paper CH1461-3/79, 0000-0385. Notched grooves as narrow as 1 micron are provided by anisotropic etching, IEEE Transactions Electron Device, Volume ED-25, #10, October 1978, and "UMOS Transistors on (110) Silicon", Ammar and Rogers, Transactions IEEE, ED-27, May 1980, pages 907–914.

Figure 2:
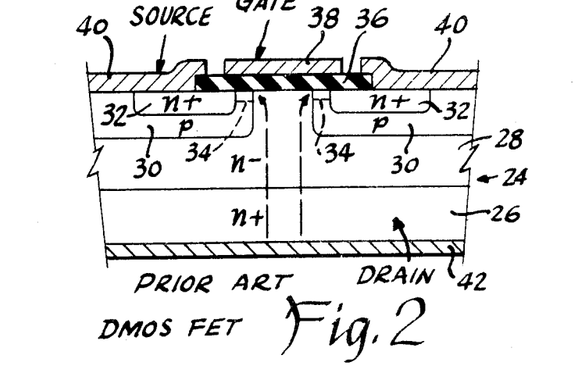
FIG. 2 is a schematic cross-sectional view of a DMOS FET.

An alternative configuration is the DMOS (double diffused metal oxide semiconductor) FET 24, FIG. 2. N+ starting material 26 has an n− epilayer 28 into which p and n+ diffusions form regions 30 and 32. FET channel region 34 is formed at the top major surface over which insulating layer 36 is deposited, followed by gate metalization 38. Upon application of a positive voltage on gate electrode 38 relative to source electrode 40, electrons in p type region 30 are attracted towards the gate and congregate at the top major surface to thus invert the conductivity type along channel region 34 to n type. Current thus flows from drain electrode 42 through regions 26 and 28 and then through channel region 34 and then through source region 32 to source electrode 40, as shown by dashed line.

In the VMOS, UMOS and DMOS devices, the p body and the n+ source diffusions are carried out through the same opening in a silicon dioxide covering layer. As a consequence, the active channel region in DMOS FETs is also controlled by the difference in the diffusion depths. Lateral penetration is about 80% that of the vertical depth.

Stability of the operating specifications in MOS devices involves control of their threshold voltages, i.e., the value of the gate voltage required to produce the onset of drain to source conduction. This parameter is strongly influenced by the surface conditions of the silicon just over the channel region and the purity of the silicon dioxide, $SiO_2$ such as layers 14, FIG. 1, and 36, FIG. 2. During the thermal growth of the oxide, hydrogen chloride is introduced into the system to act as a gettering agent, thus providing fairly pure material.

A particularly troublesome element is sodium because any $Na+$ ions in the oxide tend to reduce the threshold of n channel devices, and an overabundance of them can prevent turn-off altogether. If aluminum gate metal is placed directly onto the gate oxide, these ions, if present in the aluminum, can drift into the silicon dioxide and degrade the device performance. This is true for VMOS, UMOS, and DMOS devices.

Figure 3:
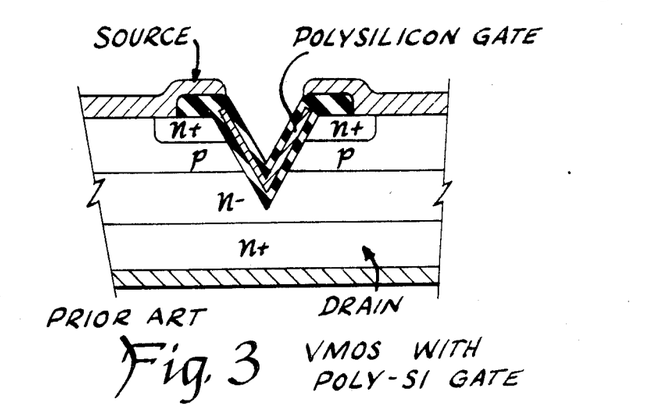
FIG. 3 is a schematic cross-sectional view of a VMOS FET with a polysilicon gate.
Figure 4:
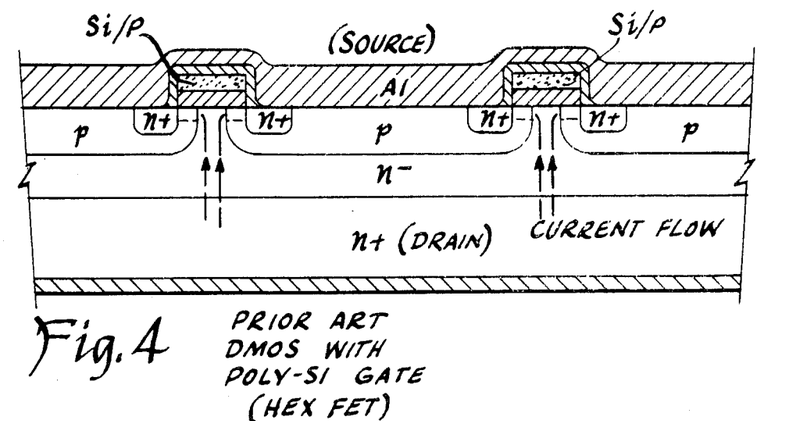
FIG. 4 is a schematic cross-sectional view of a DMOS FET with a polysilicon gate (HEXFET).
Figure 5:
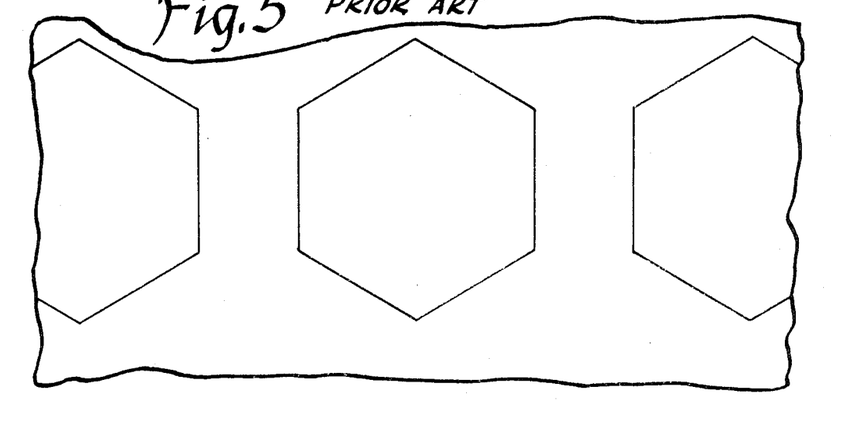
FIG. 5 shows a top view of the structure of FIG. 4, illustrating the HEX outline.

If, however, the transistors are fabricated with a phosphorous rich polycrystalline silicon (polysilicon or poly-si) gate, the technology for these materials allows much purer gates to be constructed with much more stable thresholds. Examples of VMOS and DMOS (HEXFET) devices utilizing this technology are shown in FIGS. 3 and 4. FIG. 5 shows a top view of the structure of FIG. 4, illustrating the HEX outline. Gate electrode connections are attached along the edge of the wafer. The VMOS structure is classified as a vertical non-planar unit. The HEXFET structure is a vertical planar unit.

Figure 6:
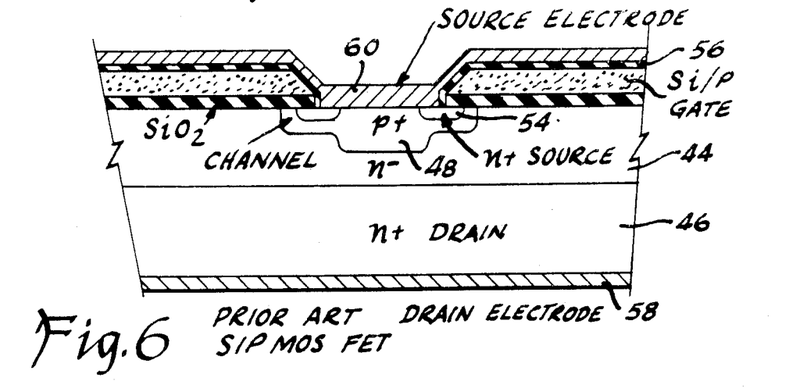
FIG. 6 is a schematic cross-sectional view of a SIPMOS/FET.
Figure 7:
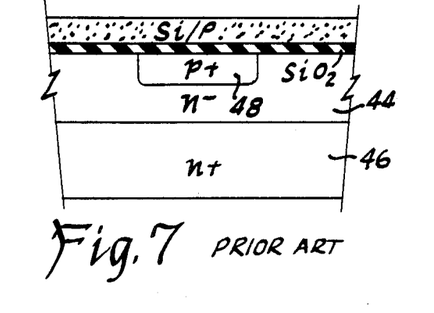
FIGS. 7–10 schematically illustrate the process steps yielding the structure of FIG. 6.
Figure 8:
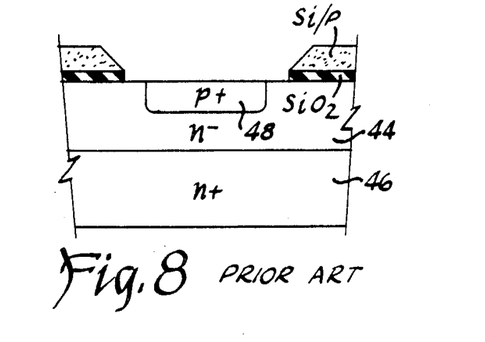

Another vertical planar unit is the SIPMOS structure shown in FIG. 6. An n− epitaxial layer 44 is grown on an n+ substrate 46, FIG. 7. The thickness and resistivity of epilayer 44 is determined by the breakover voltage versus ON state resistance compromise. Using standard photolithography techniques, a p+ layer 48 (boron) is driven into the epilayer approximately 2 to 3 microns. The wafer is then stripped of old silicon dioxide and a new extremely clean 50 to 60 nanometer silicon dioxide layer is grown, usually in an environment of hydrogen chloride. Polycrystalline silicon is then deposited on top of the wafer using the LPCVD (low pressure chemical vapor deposition) method. An n+ diffusion into the entire polysilicon layer is then performed to provide for the gettering action of the phosphorous against sodium ions and provide a means to reduce the resistivity of the gate material, although it will still be a factor of 3,000 higher than aluminum. The entire surface of the polysilicon-phosphorous (Si/P) layer is bombarded by ion implantation in order to intentionally damage the top surface. Photoresist material is placed on the Si/P, developed and etched. Since the top etches faster than the bottom, due to the damage, the taper shown in FIG. 8 results. By using this tapered gate arrangement, the subsequent implants are more uniform up to the silicon gate oxide surface.

Figure 9:
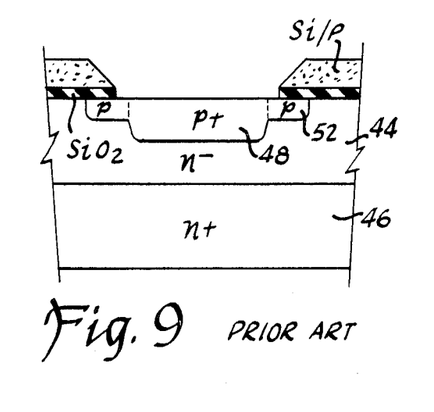
Figure 10:
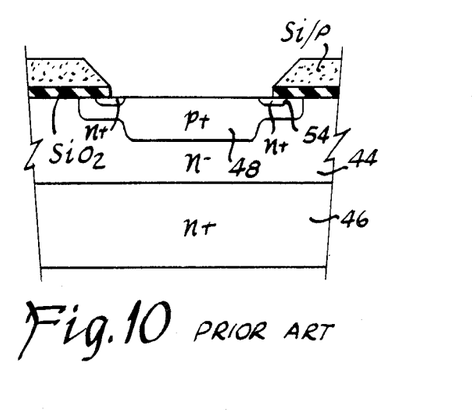

A light, carefully controlled, ion implanted p region 52, FIG. 9, is now added, which will be the channel region. After implantation, a drive-in diffusion moves this layer about one micron below the wafer surface. No oxide masking is needed because the Si/P gate serves that function as mentioned above. An n+ source region 54 is now ion implanted through the same opening in the Si/P gate grid structure. The impurity density is selected such that p+ region 48 is greater than n+ source region 54, and the depth of n+ source region 54 is typically 0.4 microns. A heavy low temperature oxide layer 56, FIG. 6, is applied, followed by a pre-ohmic and ohmic aluminum step yielding drain electrode 58 and source electrode 60.

As noted above, almost all power MOSFET design has been concentrated on vertical configurations. An example of the other general class of MOSFETs, the lateral type, is shown in FIG. 11.

Lateral MOSFET 62 has a substrate including an n− epitaxial layer 64 into which are diffused p region 66, n+ source region 68 and n+ drain region 70. Upon application of a positive voltage on gate electrode 72 relative to source electrode 74, electrons in p region 66 are attracted to the top surface of the substrate to invert the conductivity type along channel region 76 to n type, whereby electrons flow from source 68 through channel 76 through drift region 62 to drain 70, and current thus flows from drain electrode 78 through channel 76 to source electrode 74. The principal advantage of lateral device 62 is ease of implementation in integrated geometries where all leads are accessible.

Figure 11:
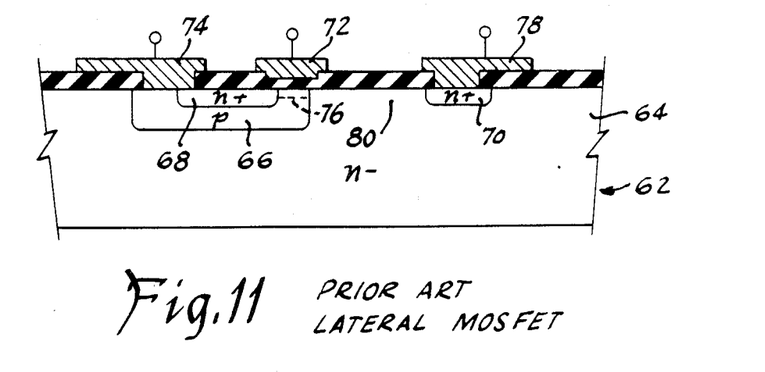
FIG. 11 is a schematic cross-sectional view of a lateral MOSFET.

As with the previously mentioned vertical MOSFETs, the lateral MOSFET 62 of FIG. 11 is uni-directional.

Device 62 is subject to the above noted tradeoff between lateral length of the drift region 80 (i.e., the distance between regions 76 and 70) versus the blocking voltage. Blocking voltage can be increased by making drift region 80 longer, but this in turn undesirably increases the ON state resistance.

It will be noted that each of the above references is to enhancement mode devices. Since the electron mobility is about 2.5 times greater than the hole mobility in silicon, the most common channel is n type. The ON state channel resistance is determined by the degree to which one can enhance the initial conductivity of the semiconductor. Thus larger gate voltages generally produce lower ON state resistances. If the devices were constructed as depletion mode units, the ON state resistance occurring at zero gate signal would be fixed by the conductivity of the starting material. Little if any reduction in ON state resistance could be effected by application of gate voltage. Since the starting resistivity must be high in order to sustain high blocking voltages in the OFF state, the ON state resistance of depletion mode devices currently being fabricated is considered too large to be a serious contender in power FET development. From this perspective, since all current JFETs are depletion mode devices, JFET configurations have not been seriously considered for power switching applications.

DETAILED DESCRIPTION OF THE INVENTION

Reviewing FIGS. 1 through 11, it is seen that in each case the transistor will not support a reverse drain to source voltage. Each device is uni-directional in that only one junction drop separates drain and source when (for the n channel devices shown) the drain is negative with respect to the source. In many applications, these devices can be effectively employed. But if AC line voltage is to be the drain-source driving function, then a bi-directional design becomes mandatory. Again, inspection of the device geometries in FIGS. 1 through 11 shows that the reason for the uni-directional design stems from the use of the device as a three terminal element, i.e. both the drain and the gate voltages are referenced to the common source point. It is necessary that the source electrode be in contact with the n+ source region and also with the p body region (to provide the gate return contact). Thus, the blocking action of the pn epijunction is negated.

Referring to FIG. 1, for example, if device 2 were supplied with a separate electrode for p region 8, and the source metalization 18 contacted only the n+ source region 10, a bi-directional FET would result. There would be considerable asymmetry due to unequal blocking capabilities of the n region 6 and p region 8. Likewise in FIG. 11, if a separate electrode is provided for p region 66 and if source metalization 74 contacted only source region 68, then a bi-directional FET would result, but there would be considerable asymmetry due to the unequal blocking capabilities of n region 64 and p region 66. Thus a new geometry and perhaps technology would be required.

Though not limited thereto, the present invention evolved from efforts to provide bi-directionality in a power FET without having to overcome these immediately above noted difficulties. The invention has broad application, however, to various lateral FETs where it is desired to increase voltage blocking capability without increasing lateral dimensions. The disclosed preferred embodiment provides in combination a simple yet effective MOSFET structure avoiding the noted difficulties while providing bidirectional current flow with high voltage blocking capability in minimum lateral dimensions.

Figure 12:
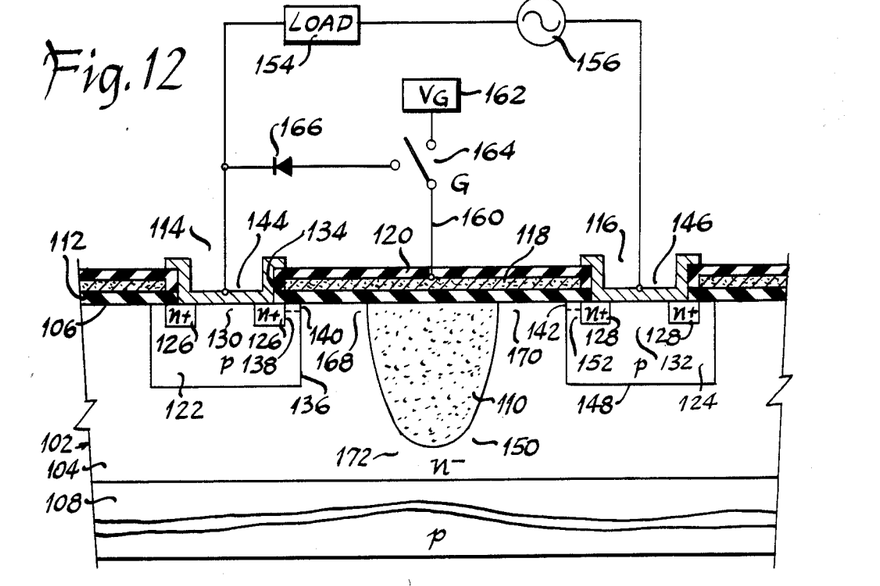
FIG. 12 is a schematic sectional view of FET structure constructed in accordance with the invention.

FIG. 12 schematically shows bi-directional FET structure constructed in accordance with the invention. FET 102 includes a substrate 104 of semiconductor material of one conductivity type having a top major surface 106. In preferred form, substrate 104 is an n- epitaxial layer grown on a base layer of semiconductor material such as p layer 108. A porous silicon region 110 is formed in substrate 104 in accordance with known processing techniques, including anodization of the silicon by passing a fixed current therethrough in the localized region in the presence of concentrated hydrogen floride to create a structural change in the silicon which remains single crystalline but becomes porous. After the anodization, the substrate is subjected to an oxidizing atmosphere such that the oxygen enters the pores in the porous region and rapidly oxidizes region 110, whereby region 110 is still single crystalline with substrate 104 but substantially non-conductive. An alternative to the porous silicon is an anisotropic etch wherein region 110 is etched away and then filled with an insulating oxide in accordance with the so called "doctor blade" process.

An insulating layer of silicon dioxide 112 is deposited on the substrate, followed by masking and etching to provide openings 114 and 116, and deposition of polysilicon gate 118 and top silicon dioxide insulating layer 120. A pair of p tub regions 122 and 124 are diffused into substrate 104 from top major surface 106 through openings 114 and 116, respectively. N+ regions 126 and 128 are diffused into respective p regions 122 regions 122 and 124 through these same holes 114 and 116, respectively, in the oxide layer, comparably to the double diffusion process noted above. N+ region 126 is prevented from forming in the central section 130 of p region 122 by a separate masking step, or in accordance with the SIPMOS process noted above, and likewise for central section 132 of p tub 124. Both the p and the n+ diffusions are performed through the same hole and thus the oxide edge 134 provides aligned registry. The diffusion parameters control the lateral penetration of p edge 136 and n+ edge 138, which in turn control the lateral length of channel region 140 formed therebetween, and likewise for channel region 142.

Metalizations 144 and 146 are deposited in openings 114 and 116 to ohmically contact respective source regions 126 and 128 and respective tub regions 122 and 124. Metalizations 144 and 146 provide the main electrodes for current flow through the device as controlled by gate electrode 118. Gate electrode 118 is insulatingly spaced above top major surface 106 by insulating silicon dioxide layer 112 and extends across both channels 140 and 142 and across central insulative region 110 of substrate 104 which extends from top major surface 106 downwardly into the drift region between the channels.

Upon application of a positive voltage to gate electrode 118 with respect to source region 126 and main electrode 144, electrons in p region 122 are attracted to top major surface 106 to thus invert the conductivity type in channel region 140 to n type. If main electrode 146 is positive with respect to main electrode 144, current may then flow from p region 124 momentarily across forward biased pn juntion 148 into drift region 150, then through channel 140 to source 126 and main electrode 144. As soon as current starts to flow through the FET, the voltage across the main electrodes drops, which in turn reduces the potential in the various regions of the FET, including portion 152 of p tub 124 below the other FET channel 142. Portion 152 thus becomes negative relative to gate 118, whereby positive gate 118 attracts electrons toward top major surface 106 to thus invert the conductivity of channel 142 to n type and hence render channel 142 conductive. Forward biased pn junction 148 thus conducts only momentarily until the second channel 142 turns on. The main current path through FET 102 is from main electrode 146 through source 128 through channel 142, through drift region or drain 150, through channel 140, through source 126 to main electrode 144.

The structure is bilateral, and thus current may also flow from main electrode 144 to main electrode 146 when gate 118 is positive with respect to source 128. Electrons in p region 124 are attracted to top major surface 106 by gate electrode 118 thereabove to thus invert channel region 142 to n type, and hence allow electron flow from n+ source 128 into drift region 150. If main electrode 144 is positive with respect to main electrode 146, current then flows from p region 122 momentarily across forward biased pn junction 136 until channel 140 turns on. The main current path is from main electrode 144, through source 126, through channel 140, through drift region 150, through channel 142, through source 128 to main electrode 146.

The application of electrical gate potential to gate electrode 118 enables the latter to produce electric fields of sufficient intensity to invert the conductivity type in at least a portion of the first and second channel regions 140 and 142. Upon application of voltage of either polarity to the first and second source regions 126 and 128, electric current can flow in a respective corresponding direction between them, under control of the electrical gate potential of the gate electrode means 118. The current flow between these spaced apart regions 126 and 128 is controllable by controlling the electric fields in the channel regions 140 and 142 which are in turn controllable by controlling the electric potential on the gate electrode means 118.

In the absence of gate potential on gate electrode 118, channel regions 140 and 142 are p type, and the device is in a blocking OFF state. Current from main electrode 144 to main electrode 146 is blocked by junction 148. Current flow in the other direction from main electrode 146 to main electrode 144 is blocked by junction 136.

Bi-directional FET 102 may be used to control AC power. FIG. 12 schematically shows a load 154 and a source of AC power 156 connected across main electrodes 144 and 146 of the FET. Gate electrode 118 is connected by gate terminal 160 to a source of gate potential 162 through switch means 164. In the ON state of FET 102, switch 164 is in an upward position such that a given polarity gate potential is applied to gate electrode 118 from source 162. When main electrode 146 is positive with respect to main electrode 144, as driven by AC source 156, gate electrode 118 is positive with respect to source region 126 and main electrode 144 connected to p region 122. Hence, channel 140 is inverted to n type and conduction occurs, i.e. current flows from positive main electrode 146, through source region 128, through channel 142, through drift region 150, through channel 140, through source 126 to negative main electrode 144 and through load 154.

In the other half cycle of the AC source 156, main electrode 144 is positive with respect to main electrode 146, and gate electrode 118 is positive with respect to source region 128 and p region 124 connected to negative main electrode 146. Conduction is thus enabled through channel 142, and current flows from positive main electrode 144 through source 126, through channel 140, through drift region 150, through channel 142, to source 128 and main electrode 146.

In preferred form, gate terminal 160 is referenced to the same potential level as one of the main electrodes in the OFF state of FET 102. In the leftward position of switch 164, gate terminal 160 is connected through reverse blocking diode 166 to main electrode 144.

Assume FET 102 is in the OFF state and gate terminal 160 is tied through diode 166 to main electrode 144, and further assume that the voltage on main electrode 146 is rising positively with respect to main electrode 144 as driven by AC source 156. The potential level in substrate 104 thus also rises positively since there is only a single junction voltage drop across junction 148 thereto from p region 124 connected to main electrode 146. Substrate 104 is thus positive with respect to gate electrode 118 because the latter is tied to the relative negative main electrode 144. Stated another way, gate electrode 118 is negative with respect to substrate 104. Negative gate electrode 118 thus attracts holes in substrate 104 up toward the top major surface 106 in the areas 168 and 170. If the relative potential is strong enough, these areas 168 and 170 can be inverted to p type channel regions, which if allowed to extend towards each other and meet would form a conductive p channel beneath top major surface 106 between p tubs 124 and 122. In this latter case, FET 102 would lose its OFF state voltage blocking capability and pass current therethrough.

The porous silicon insulative region 110 prevents the inducement of a conductive channel along the underside of top major surface 106 between areas 168 and 170, whereby to enable higher OFF state voltage blocking capability, i.e., a higher positive voltage can be applied to main electrode 146 without avalanche breakdown. The area 172 of substrate 104 below the lowermost reach of region 110 is spaced by a substantially greater distance from gate electrode 118 and hence substantially eliminates attraction of holes into region 172, whereby to prevent an induced conductive channel therein around the bottom of region 110.

It is to be noted that the length of drift region 150 is substantially increased by insulative region 110, without an increase in the lateral dimension between the main electrodes 144 and 146 or the channels 140 and 142. The drift region is made to bend downwardly, then around and then upwardly along the outer boundary of insulative region 110 between areas 168 and 170. This structure enables further enhancement of the OFF state voltage blocking capability because of the increased length of drift region 150, and yet the lateral dimension along top major surface 106 remains the same. This increased voltage blocking capability within a smaller lateral dimension enables a higher number of cells per unit area to be incorporated on a chip. This increased cell density enables a given chip size to have a greater number of FETs thereon connected in parallel, to thus reduce the ON state resistance, to be more fully described hereinafter.

Figure 13:
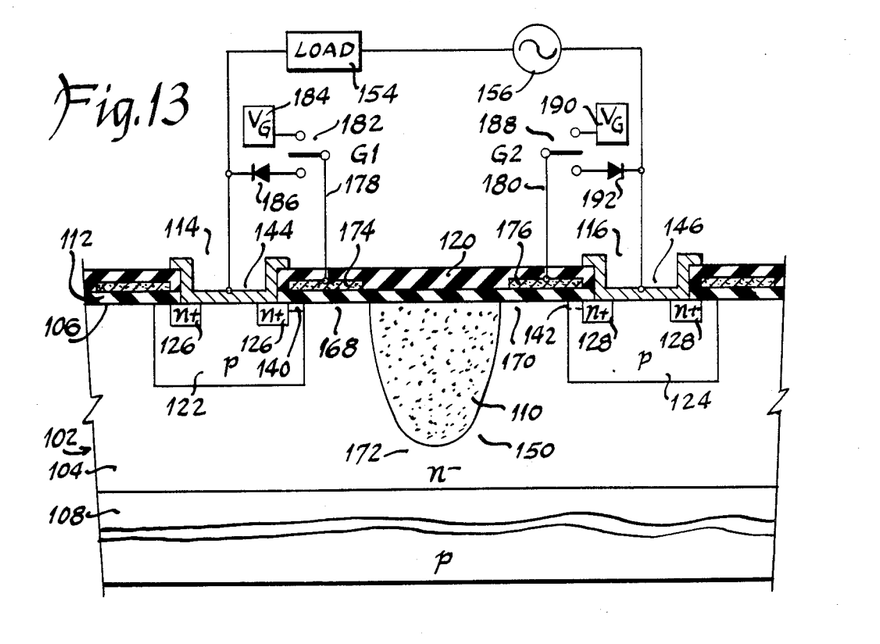
FIG. 13 is a view like FIG. 12 and shows an alternate embodiment.

FIG. 13 shows an alternate embodiment of the structure in FIG. 12 and like reference numerals are used where appropriate to facilitate clarity. The gate electrode means is altered from the single continuous gate electrode 118 of FIG. 12 to a split gate arrangement including a pair of laterally spaced separate gate electrodes 174 and 176. Gate terminals 178 and 180 are each connected to a respective gate electrode and may be connected in common to a single gate terminal such as 160 in FIG. 12, and gated as shown in FIG. 12. Alternatively, gate terminals 178 and 180 may each be referenced to a different one of the main electrodes 144 and 146 as shown in FIG. 13. Gate terminal 178 is connected through switch means 182 to a source of gating potential 184 in the upward ON state of switch 182, and is connected to main electrode 144 through reverse blocking diode 186 when switch 182 is in a downward OFF condition. Gate terminal 180 is connected through switch means 188 to a source of gating potential 190 when switch 188 is in an upward ON condition and is connected to main electrode 146 through reverse blocking diode 192 when switch 188 is in a downward OFF condition.

The split gates 174 and 176 of FIG. 13 provide further enhanced voltage blocking capability in the OFF state of FET 102. Due to the split gate structure, the induced inversion of conductivity type to p type in areas 168 and 170 in the OFF state is diminished. For example, the holes in substrate 104 attracted to top major surface 106 beneath gate electrode 174 do not extend as far rightwardly due to the split gate arrangement. The potential conductive channels in area 168 are thus shorter, as hole concentration decreases from left to right. Likewise, hole concentration in the OFF state in area 170 decreases from right to left due to the split gate arrangement. The chances of induced conduction channels meeting each other from areas 168 and 170 is thus even further diminished. Higher voltage may thus be applied across the main electrodes 144 and 146 in the OFF state without causing breakdown.

Other gating arrangements and techniques are of course feasible. For example the gate electrode means, whether the single continuous electrode 118 of FIG. 12 or the split gate electrodes 174 and 176 of FIG. 13, may be isolated and allowed to float in the OFF state of FET 102. This provides high voltage blocking capability because the gate electrode means will not appear to be negative relative to the high positive potential in substrate 104, and hence hole attraction to areas 168 and 170 is diminished. Numerous circuit applications, however, make it desirable or convenient to tie the gate electrode means to a common reference potential level with one of the main electrodes, and hence the arrangements of FIGS. 12 and 13 are preferred.

Other gating techniques include driving the gate from the AC line power off of source 156 through appropriate threshold and protective circuitry, driving the gate through synchronizing circuitry such as a phase lock loop from the AC line to be clocked at a given point in each cycle, or, in the case of a floating gate, driving the gate from an optically or otherwise isolated gate power source, to name a few. One desirable type of gating arrangement is that shown in copending application Ser. No. 6/390,721, filed June 21, 1982, wherein a current source is connected to a common point between the FET gates, which common gate point is referenced through a resistor and a pair of diodes to the most negative of the main electrodes. The load and AC source may also be connected in a variety of manners, for example the AC source may be coupled to the FET through an isolation transformer.

There is thus shown in FIG. 12 high density, high voltage lateral FET structure 102 comprising: a source region 126; a channel region 140 forming a junction 138 with source region 126; a drift region 150 through areas 168, 172 and 170 and forming another junction 136 with channel region 140; first circuit connection means 144 communicating with source region 126; second circuit connection means comprising electrode 146 and regions 128 and 124 communicating with drift region 150; an insulative region 110 in drift region 150 between channel region 140 and the second circuit connection means; gate means 118 disposed proximate at least channel region 140 and adapted for application of an electrical potential for producing an electric field of sufficient intensity to invert the conductivity type in channel region 140; whereby upon application of voltage across the first and second circuit connection means, electric current can flow therebetween under control of the electrical potential of the gate means, and such that in the absence of the electrical gate potential, insulative region 110 prevents induced conductive channel inversion through drift region 150, to enhance OFF state voltage blocking capability. Each of the regions are disposed along top major surface 106 of the substrate, and insulative region 110 extends downwardly from top major surface 106 to divert conductive current paths therearound between channel region 140 and the second circuit connection means, whereby to lengthen the drift region conductive path, so as to sustain higher blocking voltage, without increasing the lateral dimension along top major surface 106. Drift region 150 extends at area 172 around the bottom of insulative region 110 and the upwardly along each side of insulative region 110 to top major surface 106 at areas 168 and 170. Channel region 140 and insulative region 110 are laterally spaced by the left upward extension 168 of drift region 150. The second circuit connection means and insulative region 110 are spaced by the right upward extension 170 of the drift region. In the bilateral device shown in FIG. 12, the first circuit connection means is a main electrode 144 contacting source region 126 and tub region 122, and the second circuit connection means comprises second channel region 142, second source region 128, and main electrode 146 contacting and ohmically shorting source region 128 and tub region 124. For a unilateral version, source region 128 may be deleted, and main electrode 146 may communicate with drift region 150 through region 124, or region 124 may be deleted and main electrode 146 may be in contact with drift region 150 to communicate therewith.

Figure 14:
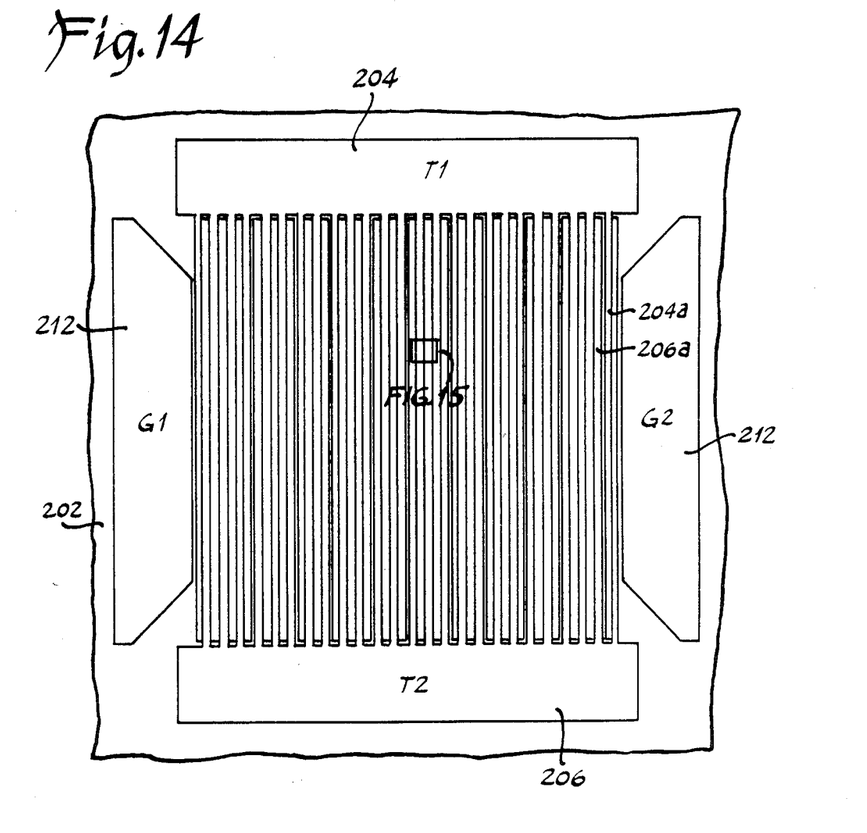
FIG. 14 is a top view of a semiconductor chip having a plurality of FETs integrated thereon in a matrix array.
Figure 15:
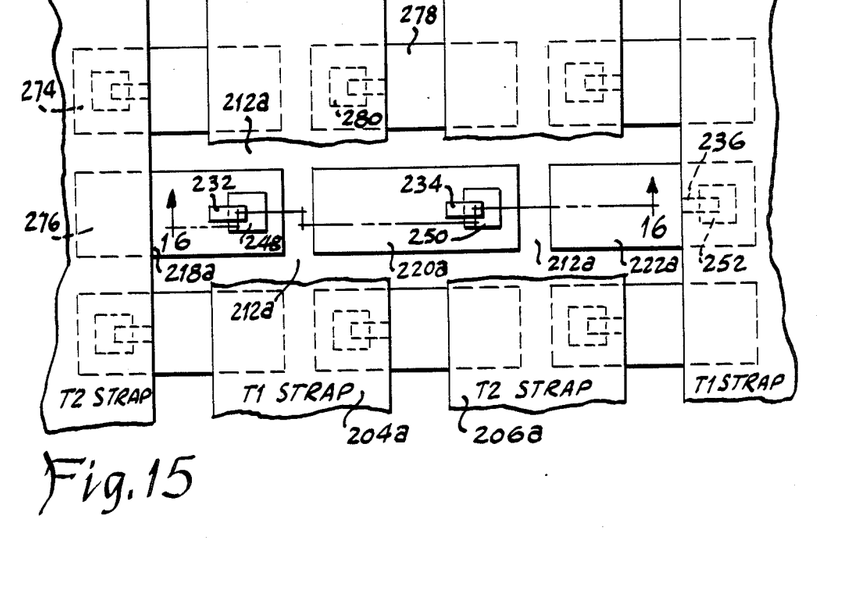
FIG. 15 is an enlarged view of the correspondingly outlined section of FIG. 14.
Figure 16:
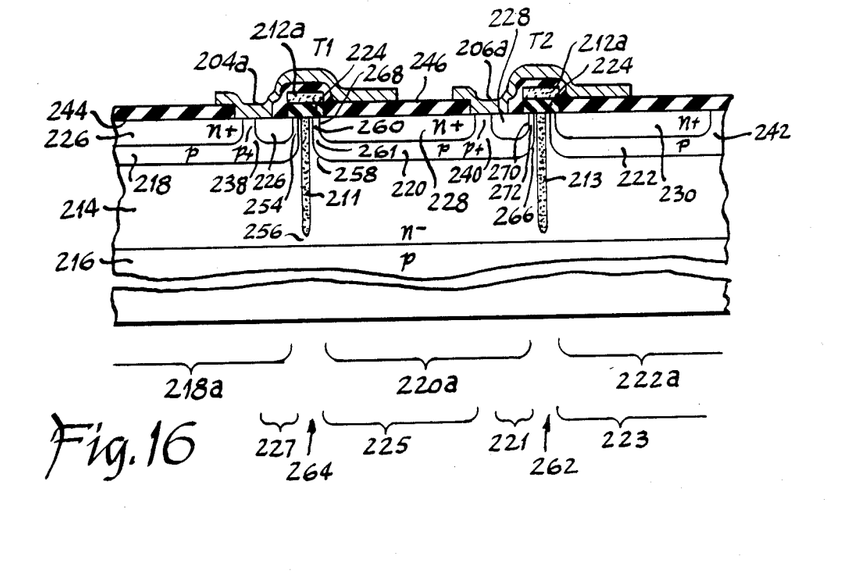
FIG. 16 is a cross-sectional view taken along line 16—16 in FIG. 15.

FIGS. 14 through 16 show the preferred implementation of the schematic structure of FIG. 12. FIG. 14 is a top view of a semiconductor chip 202 having a plurality of bi-directional FETs integrated thereon in a matrix pattern or array. The main terminals 204 (T1) and 206 (T2), corresponding to main electrodes 144 and 146, respectively, of FIG. 12, extend in interdigitated fashion by means of long narrow parallel terminal straps 204a and 206a to interconnect the plurality of FETs. A gate terminal 212 is extended to each side and interconnects the various gates, 118 in FIG. 12, by means of a continuous waffle like matrix pattern 212a, FIG. 15. For the split gate arrangement of FIG. 13, gates 174 are interconnected, for example by a right to left conductive strip underlaid near the top in FIG. 14, and brought out to left hand gate terminal 212, and gates 176 are interconnected, for example by a lower left to right conductor, and brought out to the right hand gate terminal 212 in FIG. 14 which is then separate from the left hand gate terminal 212.

FIG. 15 is an enlarged view of the correspondingly outlined section of FIG. 14. FIG. 16 is a cross-sectional view taken as shown in FIG. 15. A substrate 214, FIG. 16, is provided by an n− expitaxial layer grown on a p type base layer 216. A plurality of p diffusions form p tub regions 218, 220, 222, and so on, as defined by a waffle like matrix oxide pattern 224. The boundaries of these p tubs define a plurality of cells in the substrate such as shown in FIG. 15 at 218a, 220a, 222a, and so on. These cells are arranged in a plurality of rows and columns. An n+ diffusion is carried out in the cells formed by the p tub regions to yield n+ source regions 226, 228, 230, and so on. The areas in FIG. 15 designated 232, 234, 236, and so on, are masked or otherwise processed (for example in accordance with the above noted SIPMOS process) to prevent n+ diffusion thereunder and/or a p+ diffusion is then carried out thereunder to yield p+ regions 238, 240, 242, and so on, FIG. 16, which are continuously crystalline with the corresponding p tub sections and extend upwardly to top major surface 244. Porous silicon or anisotropically etched, etc., insulative regions 211, 213, and so on are formed as described above for FIG. 12, and extend downwardly from top major surface 244 into substrate 214 between the cells and beneath the oxide pattern 224 and gate matrix 212a. Polysilicon gate matrix 212a, deposited on oxide pattern 224, is covered by insulating silicon dioxide layer 246 extending as shown in FIG. 16. Apertures 248, 250, 252, and so on, through which the diffusions are performed also receive deposited main terminal strap metalizations to yield main terminal 204a ohmically contacting source region 226 and p tub region 218 and main terminal 206a ohmically contacting n+ source region 228 and p tub region 220.

Upon application of a positive voltage at gate terminal 212a with respect to source region 226, electrons in p tub region 218 are attracted to the top major surface 244 beneath gate terminal 212a and invert the conductivity type along channel region 254 to n type such that electrons may flow from source 226 through channel 254 into drain or drift region 256 which is a section of substrate 214 extending downwardly along insulative region 212 then around the bottom thereof and then upwardly therealong. If main terminal 206a is positive with respect to main terminal 204a then current can flow from p region 220 momentarily across forward biased pn junction 258 into drift region 256 and through channel region 254 to source 226 and terminal 204a. As before, as soon as current starts to flow through the FET, the voltage across the main terminals drops which the FET, including the portion 261 of p tub 220 below channel 260. Portion 261 thus becomes negative relative to gate 212a, whereby positive gate 212a attracts electrons toward top major surface 244 to thus invert the conductivity of channel 260 to n type and hence render channel 260 conductive. Forward biased pn junction 258 thus conducts only momentarily until the second channel 260 turns on. The main current path through the FET is from main terminal 206a through source 228, through channel 260, through drift region 256, through channel 254, through source 226 to main terminal 204a. Current flows in the reverse direction along the same path when main terminal 204a is positive with respect to main terminal 206a.

Each of the cells 218a, 220a, 222a, and so on, in the matrix array has a right portion forming a lateral FET in combination with a left portion of the next adjacent cell to the right in the same row. Correspondingly, each cell has a left portion forming a lateral FET in combination with the right portion of the next adjacent cell to the left in the same row. For example, cell 220a has a right portion 221, FIG. 16, forming a lateral FET 262 with a left portion 223 of cell 222a. Also, cell 220a has a left portion 225 forming a lateral FET 264 with a right portion 227 of cell 218a. Each of the FETs 262 and 264 is bi-directional.

As seen in FIG. 16, each cell, e.g. cell 220a, has a p tub region in substrate 214 extending laterally and then upwardly to top major surface 244 to form right and left boundaries defining right and left junctions, e.g. 258 and 266, with substrate 214. Source region 228 has right and left portions extending laterally and then upwardly to top major surface 244 to define right and left junctions 268 and 270 with the right and left upward extensions of tub regions 220. The right and left upward extensions of tub region 220 form right and left FET channels 260 and 272 immediately below top major surface 244. The right and left portions of source region 228 also extend laterally toward each other and then upwardly to top major surface 244 such that intermediate portion 240 of tub region 220 extends upwardly to top major surface 244 between the right and the left portions of source region 228. As seen in FIG. 15, the channel regions are part of respective tub regions extending laterally at least partially around respective source regions.

Main terminal 206a ohmically interconnects upwardly extending intermediate tub region portion 240 with the intermediate tub region portion of alternate cells. The other main terminal 204a ohmically interconnects upwardly extending intermediate tub region portion 238 with the remaining staggered set of alternate cells, as seen in FIG. 15. Gate terminal 212a is insulated above top major surface 244 by oxide 224 in a waffle like or matrix pattern. Each respective gate terminal portion 212a overlies and extends across the right FET channel, such as 254, of a left cell, then across the narrow upwardly extending left portion of drift region 256 below top major surface 244, then across insulative region 212, then across the narrow upwardly extending right portion of drift region 256, then across the left FET channel such as 260, of a right cell. The upwardly extending narrow spaced portions of the drift region, such as 256, and the insulative region, such as 211, beneath the gate terminal array likewise form a waffle like pattern separating the rows and columns of the cells in the matrix array.

The intermediate tub region portions, such as 240, are offset to the right or the left of center in their respective cells such that the main terminal connection point is likewise offset to the right or left in each cell. In a first row of cells, for example row 274, FIG. 15, each cell has a main terminal connection point to the left of center to thus have a left hand orientation. In a second row of cells, for example row 276, each cell has a main terminal connection point to the right of center to thus have a right hand orientation.

The main terminals 204a and 206a extend in column form perpendicular to the rows, FIG. 15. As above noted and as seen in FIG. 14, the main terminal straps extend parallel to each other in interdigitated manner. Each strap is wide enough to straddle portions of adjacent cells as shown in FIG. 15 by T1 strap 204a straddling cells 218a and 220a. Each strap is insulated above the gate terminal by silicon dioxide layer 246, FIG. 16. As seen in FIG. 15, main terminal strap 204a ohmically contacts left hand oriented cell 278 therebeneath at area 280 in first row 274, and then ohmically contacts right hand oriented cell 218a at area 248 therebeneath in second row 276 and so on. The plurality of bi-directional FETs formed by the cells are thus connected in parallel between the main terminals 204 and 206, FIG. 14.

In one implementation, chip 202 is 125 mils by 125 mils and contains 2,580 cell pairs. Each cell is 55 microns long by 20 microns wide, and the lateral width of each gate segment 212a is 10 microns. The p tub regions, such as 220, FIG. 16, are diffused to a depth of approximately 3 microns, and the n+ source regions, such as 228, are diffused to a depth of about 1 micron. The insulative regions, such as 211, are diffused to a depth of about 15 microns. The resistance of the device in the ON state is extremely low due to the high packing density affording a large number of FETs per unit area.

Insulative regions 211, 213 and so on, lengthen the drift region, such as 256, without lengthening the lateral dimension along top major surface 244. This structure affords a higher voltage blocking capability within a smaller lateral area. This in turn allows a larger number of FETs per unit area on a chip, which when connected in parallel reduce the ON state resistance of the device.

It is recognized that various modifications are possible within the scope of the appended claims.

We claim:

1. High density, high voltage lateral FET structure, comprising:
   a source region of one conductivity type semiconductor material;
   a channel region of opposite conductivity type semiconductor material forming a junction with said source region;
   a drift region of said one conductivity type semiconductor material forming another junction with said channel region;
   first circuit connection means communicating with said source region;
   second circuit connection means communicating with said drift region;
   an insulative region in said drift region between said channel region and said second circuit connection means;
   gate means disposed proximate said channel region and adapted for application of an electrical potential for producing an electric field of sufficient intensity to invert the conductivity type in said channel region;
   whereby upon application of voltage across said first and second circuit connection means, electric current can flow therebetween under control of said electrical potential of said gate means, and such that in the absence of said electrical gate potential, said insulative region prevents induced conductive channel inversion through said drift region, to enhance OFF state voltage blocking capability;
   wherein each of said regions is disposed along a top major surface of a semiconductor substrate, and wherein said insulative region extends downwardly from said top major surface to divert conductive current paths therearound between said channel region and said second circuit connection means, whereby to lengthen the drift region conductive path, so as to sustain higher blocking voltage, without increasing the lateral dimension along said top major surface;

wherein said insulative region comprises porous silicon filled with oxide to substantially reduce the conductivity therethrough and effectively divert conduction paths therearound.

2. An integrated plural lateral FET structure for bi-directional power switching, comprising:

a semiconductor chip comprising a substrate of one conductivity type;

a plurality of laterally spaced cells forming a matrix array on said substrate along a top major surface thereof;

each said cell having a right portion forming a lateral FET in combination with the left portion of the next adjacent cell to the right;

each cell having a left portion forming a lateral FET in combination with the right portion of the next adjacent cell to the left;

a plurality of singular drift regions of said one conductivity type each formed by said substrate between respective said cells, each said singular drift region supporting OFF state blocking voltage in both directions;

each cell comprising:

a tub region of opposite conductivity type in said substrate and extending laterally and then upwardly to said top major surface to form right and left boundaries defining right and left junctions with said substrate;

source region means of said one conductivity type in said tub region and having left and right portions extending laterally and then upwardly to said top major surface to define right and left junctions with said right and left upward extensions of said tub region;

said right and left upward extensions of said tub region forming right and left FET channels immediately below said top major surface;

said right and left source region portions also extending laterally towards each other and then upwardly to said top major surface such that an intermediate portion of said tub region extends upwardly to said top major surface between said right and left source region portions;

a plurality of laterally spaced insulative regions forming a matrix array on said substrate along said top major surface and extending downwardly into said substrate to a predetermined depth, each said insulative region spaced laterally between a right said cell and a left said cell;

first main electrode means ohmically interconnecting said upwardly extending intermediate tub region portion at said top major surface with the intermediate tub region portion of alternate cells;

second main electrode means ohmically interconnecting said upwardly extending intermediate tub region portions of the remaining alternate cells;

gate electrode means insulated above said top major surface of said substrate in a waffle-like matrix pattern with each respective gate electrode section including at least a portion overlying and extending across said right FET channel of a left cell, and at least a portion extending across said left FET channel of a right cell;

said substrate having a left portion extending upwardly to said top major surface between said insulative region and a left said cell, and having a right portion extending upwardly to said top major surface between said insulative region and a right said cell, said insulative region and said right and left upward substrate extensions likewise forming a waffle-like pattern separating the rows and columns of said cells in said matrix array.

3. The invention according to claim 2 wherein said upwardly extending intermediate tub region portion is offset to the right or left of center in said cells such that said main electrode connection point is likewise offset to the right or left in each cell;

in a first row of cells, each cell having said main electrode connection point to the left of center to thus have a left hand orientation;

in the second row of cells, each cell having said main electrode connection point to the right of center to thus have a right hand orientation.

4. The invention according to claim 3 wherein said first and second main electrode means extend in column form perpendicular to said rows, said first and second main electrode means extending parallel to each other in interdigitated manner by means of a plurality of terminal straps, each strap extending perpendicularly across said rows and being wide enough to straddle portions of adjacent cells in each row, each strap insulated above said gate electrode means, a given strap ohmically contacting a left hand oriented cell thereunderneath in a first row and then ohmically contacting a right hand oriented cell thereunderneath in the second row, and so on.

5. The invention according to claim 2 wherein said substrate includes an epitaxial layer of predetermined depth into which said regions are formed, and wherein said insulative regions extend to a depth less than that of said expitaxial region but greater than that of said tub regions.

* * * * *